US008986794B2

(12) United States Patent
Seo et al.

(10) Patent No.: US 8,986,794 B2
(45) Date of Patent: Mar. 24, 2015

(54) VAPOR DEPOSITION APPARATUS AND METHOD OF MANUFACTURING ORGANIC LIGHT-EMITTING DISPLAY APPARATUS

(75) Inventors: Sang-Joon Seo, Yongin (KR); Jae-Eung Oh, Ansan-si (KR)

(73) Assignees: Samsung Display Co., Ltd., Giheung-Gu, Yongin, Gyeonggi-Do (KR); Industry-University Cooperation Foundation Hanyang University Erica Campus, Sangnok-Gu, Ansan-Si, Gyeonggi-Do (KR)

( * ) Notice: Subject to any disclaimer, the term of this patent is extended or adjusted under 35 U.S.C. 154(b) by 41 days.

(21) Appl. No.: 13/607,534

(22) Filed: Sep. 7, 2012

(65) Prior Publication Data

US 2013/0108778 A1    May 2, 2013

(30) Foreign Application Priority Data

Nov. 1, 2011    (KR) .................. 10-2011-0112877

(51) Int. Cl.
*C23C 16/00* (2006.01)
*H05B 33/10* (2006.01)
*C23C 16/44* (2006.01)
*C23C 16/455* (2006.01)
*C23C 16/54* (2006.01)
*H01L 51/56* (2006.01)

(52) U.S. Cl.
CPC ....... *C23C 16/4412* (2013.01); *C23C 16/45542* (2013.01); *C23C 16/45548* (2013.01); *C23C 16/45574* (2013.01); *C23C 16/54* (2013.01); *H01L 51/56* (2013.01)
USPC ........... 427/569; 427/574; 427/576; 427/577; 427/579; 118/723 R

(58) Field of Classification Search
None
See application file for complete search history.

(56) References Cited

U.S. PATENT DOCUMENTS

| 2003/0049388 A1 | 3/2003 | Cho et al. |
| 2006/0250084 A1* | 11/2006 | Cok et al. ..................... 313/512 |
| 2010/0068413 A1 | 3/2010 | Lee |
| 2010/0075037 A1 | 3/2010 | Marsh et al. |
| 2011/0006040 A1* | 1/2011 | Savas et al. ..................... 216/71 |

FOREIGN PATENT DOCUMENTS

| KR | 10-2004-0080593 | 9/2004 |
| KR | 10-2005-0073387 | 7/2005 |
| KR | 10-2006-0117607 | 11/2006 |
| KR | 10-2010-0032315 | 3/2010 |
| KR | 10-2011-0046551 | 5/2011 |

* cited by examiner

*Primary Examiner* — Joseph Miller, Jr.
(74) *Attorney, Agent, or Firm* — Robert E. Bushnell, Esq.

(57) ABSTRACT

A vapor deposition apparatus efficiently performs a deposition process to form a thin film with improved characteristics on a substrate, and a method manufactures an organic light-emitting display apparatus by using such vapor deposition apparatus. The vapor deposition apparatus includes a body including an upper member and a lateral member coupled to the upper member; a receiving portion disposed to face one side of the lateral member; a stage disposed in the receiving portion and supporting the substrate; a plurality of first injection portions disposed in the lateral member and injecting at least one gas into a space between the lateral member and the upper member; a second injection portion disposed in the upper member and injecting at least one gas into the space between the lateral member and the upper member; and a plasma generating portion including a coil and a power source connected to the coil.

4 Claims, 6 Drawing Sheets

VAPOR DEPOSITION APPARATUS AND METHOD OF MANUFACTURING ORGANIC LIGHT-EMITTING DISPLAY APPARATUS

CLAIM OF PRIORITY

This application makes reference to, incorporates the same herein, and claims all benefits accruing under 35 U.S.C. §119 from an application earlier filed in the Korean Intellectual Property Office on 1 Nov. 2011 and there duly assigned Serial No. 10-2011-0112877.

BACKGROUND OF THE INVENTION

1. Field of the Invention

An embodiment of the present invention relates to a vapor deposition apparatus and a method of manufacturing an organic light-emitting display apparatus, and more particularly, to a vapor deposition apparatus efficiently performing a deposition process and improving characteristics of a deposited film, and a method of manufacturing an organic light-emitting display apparatus.

2. Description of the Related Art

Semiconductor devices, display apparatuses, and other electronic devices generally include a plurality of thin films. A plurality of thin films may be formed with various methods, one of which is a vapor deposition method.

In a vapor deposition method, at least one kind of gas is used to form a thin film. Examples of the vapor deposition method include chemical vapor deposition (CVD), atomic layer deposition (ALD), and the like.

Organic light-emitting display apparatuses have a larger viewing angle, better contrast characteristics, and a faster response rate in comparison with other display apparatuses, and thus the organic light-emitting display apparatuses have drawn attention as next-generation display devices.

An organic light-emitting display apparatus generally includes an intermediate layer including an organic emission layer disposed between a first electrode and a second electrode that are arranged opposite to each other, and the organic light-emitting display apparatus further includes at least one thin film. A deposition process may be used to form the thin film in an organic light-emitting display apparatus.

Even though the organic light-emitting display apparatuses have been developed to have larger size and higher resolution, however, it is difficult to deposit a large sized thin film with desired characteristics. Furthermore, the efficiency of a process for forming such large sized thin film is difficult to be increased.

SUMMARY OF THE INVENTION

An embodiment of the present invention provides a vapor deposition apparatus efficiently performing a deposition process and improving characteristics of a deposited thin film, and a method of manufacturing an organic light-emitting display apparatus.

In accordance with an aspect of the present invention, there is provided a vapor deposition apparatus for depositing a thin film on a substrate. The vapor deposition apparatus may include a body including an upper member and a lateral member coupled to the upper member; a receiving portion disposed to face one side of the lateral member; a stage disposed within the receiving portion and supporting the substrate; a plurality of first injection portions disposed in the lateral member and injecting at least one gas into a space between the lateral member and the upper member; a second injection portion disposed in the upper member and injecting at least one gas into the space between the lateral member and the upper member; and a plasma generating portion including a coil and a power source connected to the coil.

The first injection portions may be disposed at one side of the lateral member and at another side of the lateral member disposed opposite to and facing the one side of the lateral member.

The vapor deposition apparatus may further include a slit portion disposed between the lateral member and the receiving portion, and the slit portion is connected to a DC power source.

The receiving portion may include an exhaust portion, and the exhaust portion is disposed below the stage.

The vapor deposition apparatus may further include an exhaust port disposed in the lateral member and formed so as to be spaced apart from the first injection portions.

Each first injection portion may include one end formed to face the space between the lateral member and the upper member, and the exhaust port is disposed closer to the upper member in comparison with the one end of the first injection portions.

The vapor deposition apparatus may further include a cover formed so as to cover a surface of the coil, with the surface facing the substrate among surfaces of the coil.

The cover may be formed of an insulating material.

The vapor deposition apparatus may further include an insulating member disposed in the lateral member.

Each first injection portion may include one end formed to face the space between the lateral member and the upper member, and the insulating member is formed not to overlap with the one end of the first injection portion.

The vapor deposition apparatus may further include a mask including an opening for depositing a desired pattern on the substrate.

The upper member and the lateral member are formed so as to be coupled to or separable from each other.

In accordance with another aspect of the present invention, there is provided a vapor deposition apparatus including a plurality of modules, a receiving portion, and a stage to deposit a thin film on a substrate. Each module may include a body including an upper member and a lateral member coupled to the upper member; a plurality of first injection portions disposed in the lateral member and injecting at least one gas into a space between the lateral member and the upper member; a second injection portion disposed in the upper member and injecting at least one gas into the space between the lateral member and the upper member; and a plasma generating portion including a coil disposed at one surface of the upper member and a power source connected to the coil. The receiving portion may be formed to geometrically correspond to all the modules. The stage may be disposed in the receiving portion. The substrate may be disposed on the stage.

The vapor deposition apparatus may further include a driving unit. The driving unit may move the substrate in the receiving portion when the substrate is disposed on the stage.

The plurality of modules may be arranged in parallel in one direction, and the driving unit may move the substrate in a direction parallel to the direction in which the modules are arranged.

The driving unit may move the substrate backward and forward.

The receiving portion may include an exhaust portion, and the exhaust portion may be disposed below the stage.

Each module may further include slit portions disposed between the lateral member and the receiving portion, and the slit portions may be connected to a DC power source.

The first injection portions included in each module may be disposed at one side of the lateral member and at another side of the lateral member facing the one side of the lateral member.

Each module may further include an exhaust port disposed in the lateral member and formed so as to be spaced apart from the first injection portions.

Each first injection portion may include one end formed so as to face the space between the lateral member and the upper member, and the exhaust port is disposed closer to the upper member than to the one end of the first injection portion.

Each module may further include a cover formed to cover a surface of the coil, with the surface facing the substrate among surfaces of the coil.

The cover may be formed of an insulating material.

Each module may further include an insulating member disposed in the lateral member.

Each first injection portion may include one end formed so as to face the space between the lateral member and the upper member, and the insulating member may be formed so as not to overlap with the one end of the first injection portion.

The vapor deposition apparatus may further include a mask including an opening for depositing a desired pattern on the substrate.

The modules may be formed so as to be coupled to or separable from each other, and the upper member and the lateral member of each of the modules may be formed so as to be coupled to or separable from each other.

In accordance with still another aspect of the present invention, there is provided a method of manufacturing an organic light-emitting display apparatus by using a vapor deposition apparatus, with the organic light-emitting display apparatus including a substrate and a thin film formed on the substrate. The organic light-emitting display apparatus may include a first electrode, an intermediate layer including an organic emission layer, and a second electrode. The vapor deposition apparatus may include a plurality of modules, a receiving portion geometrically corresponding to all the modules, and a stage disposed within the receiving portion and supporting the substrate. Each module may include a body including an upper member and a lateral member coupled to the upper member; a plurality of first injection portions disposed in the lateral member and injecting at least one gas into a space between the lateral member and the upper member; a second injection portion disposed in the upper member and injecting at least one gas into the space between the lateral member and the upper member; and a plasma generating portion including a coil disposed at one surface of the upper member and a power source connected to the coil. The method of forming the thin film of the organic light-emitting display apparatus may include disposing the substrate on the stage, and injecting gas toward the substrate through the first and second injection portions of each of the modules when the substrate disposed on the stage moves within the receiving portion.

The forming of the thin film may include forming an encapsulating layer on the second electrode.

The forming of the thin film may include forming an insulating layer.

The forming of the thin film may include forming a conductive layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, exemplary embodiments of the present invention will be described more fully with reference to the accompanying drawings.

Figure 1:
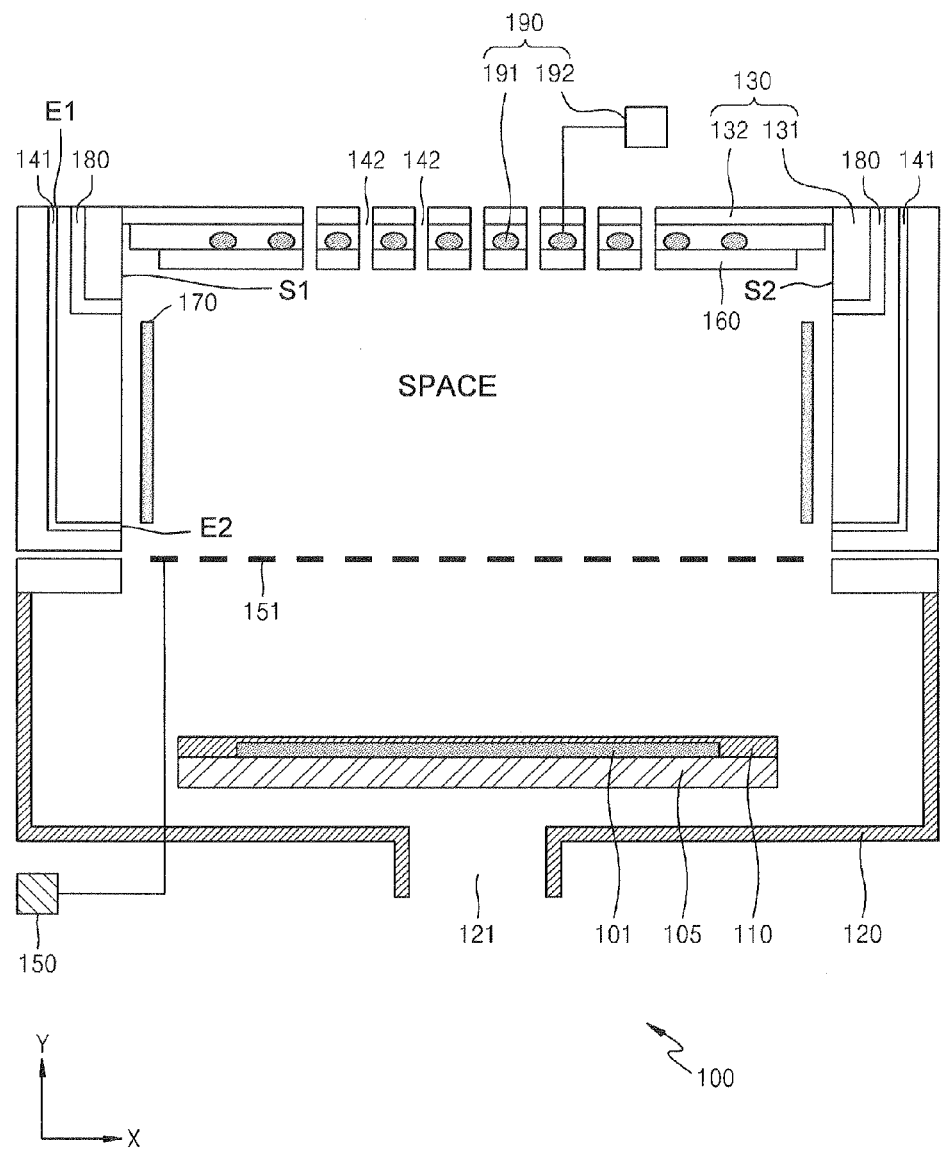
FIG. 1 is a cross-sectional view schematically illustrating a vapor deposition apparatus constructed with an embodiment of the present invention.

FIG. 1 is a cross-sectional view schematically illustrating a vapor deposition apparatus constructed with an embodiment of the present invention.

Referring to FIG. 1, the vapor deposition apparatus 100 includes a body 130, a receiving portion 120, a stage 105, a plurality of first injection portions 141, a plurality of second injection portions 142, and a plasma generating portion 190. The body 130 includes a lateral member 131 and an upper member 132. The plasma generating portion 190 includes a coil 191 and a power source 192.

The upper member 132 and the lateral member 131 are disposed so as to define a predetermined space SPACE. The lateral member 131 has a hollow pillar shape, for example, a hollow cylinder shape. The upper member 132 is disposed at an upper portion of the lateral member 131, and thus the predetermined space SPACE may be formed between the upper member 132 and the lateral member 131. That is, the body 130 has a shape in which the upper member 132 covers the inner space SPACE of the lateral member 131.

The lateral member 131 and the upper member 132 may be formed so as to be coupled to and separable from each other. In detail, a flange and a ring may be used to couple the lateral member 131 and the upper member 132 to each other.

When the lateral member 131 and the upper member 132 are separated from each other, inspection and washing of the vapor deposition apparatus 100 including the lateral member 131 and the upper member 132 may be easily performed.

The first injection portions 141 are disposed in the lateral member 131. One end E1 of each first injection portion 141 is connected to the outside of the lateral member 131 so as to receive gas, and another end E2 of each first injection portion 141 is formed so as to face the space disposed between the lateral member 131 and the upper member 132, and thus gas may be injected into the space between the lateral member 131 and the upper member 132 through each first injection portion 141. The first injection portions 141 may be disposed at one side S1 of the lateral member 131 and at another side S2 of the lateral member 131 facing the one side of the lateral member 131.

The same gas or different gases may be injected through the first injection portions 141 respectively disposed at sides of the lateral member 131.

The second injection portions 142 are disposed in the upper member 132. The second injection portions 142 may be disposed in a center portion of the upper member 132, or alternatively, a desired number of second injection portions 142 may be disposed in desired positions of the upper member 132. Gas is injected into a lower portion of the upper member 132 through the second injection portions 142, and consequently the gas is injected into the space SPACE disposed between the upper member 132 and the lateral member 131.

The plasma generating portion 190 includes the coil 191 and the power source 192. In detail, the coil 191 is disposed below the upper member 132 and is connected to the power source 192. The power source 192 applies radio frequency (RF) power to the coil 191. The coil 191 is a kind of induction coil and converts gas to a plasma state. In detail, the coil 191 may excite gas supplied through the second injection portions 142 to a plasma state. Also, the coil 191 may generate plasma using gas supplied through the second injection portions 142, and then excite gas supplied through the first injection portions 141 to a plasma state by using the plasma generated by the coil 191. The coil 191 may directly excite gas supplied through the first injection portions 141 to a plasma state.

A cover 160 is disposed on the coil 191. The cover 160 is formed of an insulating material. The cover 160 prevents the coil 191 from being damaged due to plasma or the like. The cover 160 is formed so as not to overlap the second injection portions 142. That is, the second injection portions 142 may be formed so as to penetrate the cover 160.

An insulating member 170 is formed in correspondence with an inner surface of the lateral member 131. The insulating member 170 protects the inner surface of the lateral member 131 and facilitates efficient generation and maintenance of plasma. The insulating member 170 is formed so as not to overlap the first injection portions 141. In detail, the insulating member 170 is disposed so as not to overlap one end of the first injection portions 141 facing the space between the lateral member 131 and the upper member 132. The insulating member 170 may be formed of quartz, but the present invention is not limited thereto.

An exhaust port 180 is formed in the lateral member 131. The exhaust port 180 may be connected to a pump (not shown), and discharges unnecessary gas generated during a vapor deposition process and remaining in the space between the lateral member 131 and the upper member 132. The exhaust port 180 is disposed at an upper side of the lateral member 131. That is, each first injection portion 141 includes one end formed so as to face the space between the lateral member 131 and the upper member 132, and the exhaust port 180 is disposed relatively closer to the upper member 132 in comparison with the one end of each first injection portion 141.

The receiving portion 120 is disposed so as to face the body 130. The receiving portion 120 may be disposed opposite to and face the upper member 132. In detail, the receiving portion 120 is disposed at one side of the lateral member 131. The receiving portion 120 includes an exhaust portion 121 at a lower side thereof. The exhaust portion 121 is an exit for discharging gas, and may be connected to the pump to facilitate the discharging of gas.

The stage 105 is disposed in the receiving portion 120, in particular, above the exhaust portion 121. A substrate 101 is disposed on the stage 105. In detail, the substrate 101 is disposed on an upper surface of the stage 105.

Then, a fixing unit (not shown) may be disposed so as to fix the substrate 101 on the stage 105. Examples of the fixing unit may include a clamp, a pressure member, an adhesive material, and the like.

A mask 110 is disposed on the substrate 101. The mask 110 includes an opening (not shown) formed so as to have a predetermined shape corresponding to a pattern of a thin film to be formed on the substrate 101.

A plurality of slit portions 151 are disposed between the body 130 and the receiving portion 120, specifically, between the lateral member 131 and the receiving portion 120. The slit portions 151 are connected to a direct current (DC) power source 150. The slit portions 151 improve the characteristic of plasma generated in the space between the lateral member 131 and the upper member 132 through the coil 191. That is, the slit portions 151 improve the characteristic of a thin film to be formed on the substrate 101 and improve the efficiency of a thin film forming process by allowing plasma to have a uniform characteristic and to face the substrate 101.

Figure 4:
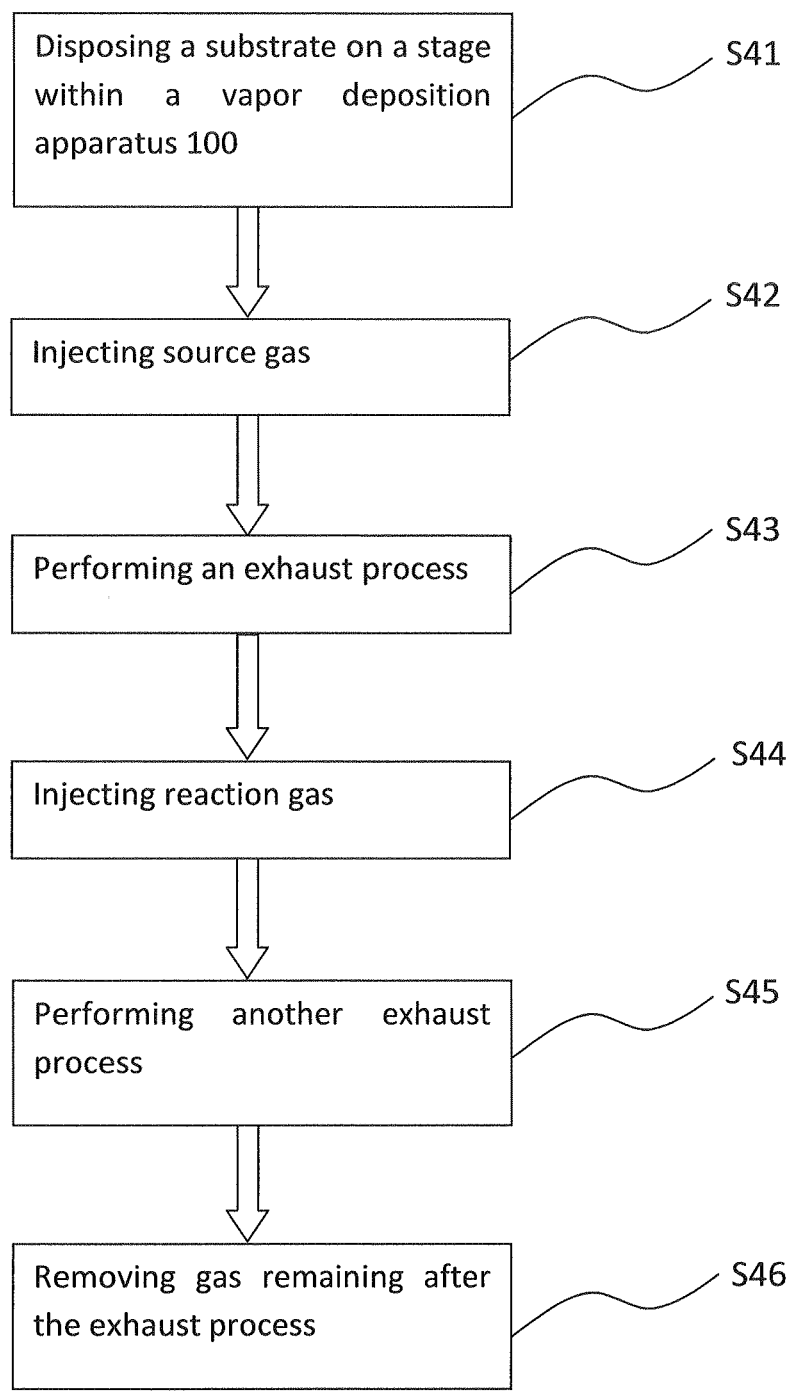
FIG. 4 is a flow chart illustrating an example of an operation method of the vapor deposition apparatus 100 of FIG. 1.

Hereinafter, an example of an operation of the vapor deposition apparatus 100 of the current embodiment will be briefly described. FIG. 4 is a flow chart illustrating the example of an operation method of the vapor deposition apparatus 100 of FIG. 1.

The substrate 101 is disposed on the stage 105 (S41). The mask 110 having the opening (not shown) patterned according to a desired pattern is disposed on the substrate 101.

A source gas is injected through the first injection portions 141 (S42). The source gas is injected into the space between the lateral member 131 and the upper member 132. The source gas is directed to the substrate 101 disposed in the receiving portion 120 through the slit portions 151.

Specifically, the source gas may contain aluminum (Al) atoms.

The source gas is absorbed onto an upper surface of the substrate 101.

Then, an exhaust process is performed through the exhaust portion 121 to form a single atomic layer or multiple atomic layers of the source gas on the substrate 101 (S43). That is, a single layer of, or multiple layers of, aluminum (Al) atoms are formed. Here, the exhaust process may be performed using a purge gas. The purge gas may be injected through the second injection portions 142. Also, the source gas and the purge gas remaining after the exhaust process may be easily removed using the exhaust port 180 formed in the lateral member 131. In particular, the exhaust port 180 may be disposed at the upper side the lateral member 131 so as to easily exhaust residual gas around the upper member 132.

Then, a reaction gas is injected through the second injection portions 142 (S44). The reaction gas injected through the second injection portions 142 is excited to a plasma state by the plasma generating portion 190. Components of the reaction gas in a plasma state pass through the space between the lateral member 131 and the upper member 132 and then through the slit portions 151, and the components move toward the substrate 101. Specifically, the reaction gas may contain oxygen (O) atoms.

The reaction gas excited to a plasma state is absorbed onto the upper surface of the substrate 101.

Then, the exhaust process is performed through the exhaust portion 121 so as to form a single atomic layer or multiple atomic layers of the reaction gas on the substrate 101 (S45). In other words, a single layer of, or multiple layers of, oxygen atoms are formed. In this regard, the exhaust process may be performed using a purge gas. The purge gas may be injected through the second injection portions 142.

Also, the source gas and the purge gas remaining after the exhaust process may be easily removed using the exhaust port 180 formed in the lateral member 131 (S46).

Accordingly, a single atomic layer of or multiple atomic layers of the source gas and the reaction gas are formed on the substrate 101. In other words, an aluminum oxide layer AlxOy is formed, wherein x and y may be adjusted according to process conditions. In the current embodiment, a process of forming the aluminum oxide layer AlxOy is described for convenience of explanation, but the present invention is not limited thereto. That is, the present invention may be applied to a process of forming any of other various layers, e.g., an insulating layer and a conductive layer.

Figure 5:
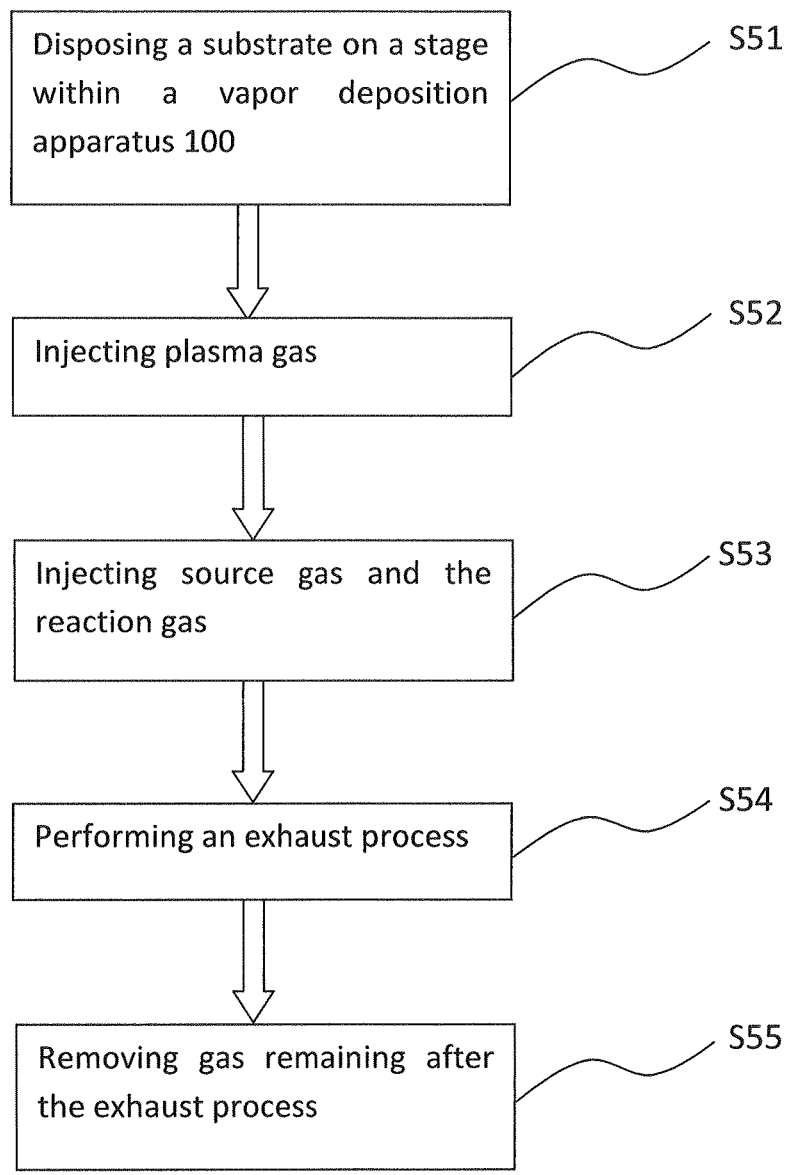
FIG. 5 is a flow chart illustrating another example of an operation method of the vapor deposition apparatus 100 of FIG. 1.

Hereinafter, another example of an operation of the vapor deposition apparatus 100 of the current embodiment will be described. FIG. 5 is a flow chart illustrating the another example of an operation method of the vapor deposition apparatus 100 of FIG. 1.

The substrate 101 is disposed on the stage 105 (S51).

A source gas and a reaction gas may be injected through the first injection portions 141 (S53). An additional plasma gas for generating plasma may be injected through the second injection portions 142 (S52). In other words, an additional plasma gas is injected into the second injection portions 142 (S52) at the same time as or before a source gas is injected through the first injection portions 141 (S53) so as to generate plasma using the plasma generating portion 190. The plasma moves toward the substrate 101 and excites the source gas. Then, when a reaction gas is injected through the first injection portions 141, the plasma generated using the plasma generating portion 190 excites the reaction gas. In this case, the source gas and the reaction gas may be injected through different first injection portions 141 so as to prevent the source gas and the reaction gas from being mixed. In other words, the source gas is injected through the first injection portions 141 disposed at one side of the lateral member 131, and the reaction gas is injected through the first injection portions 141 disposed at another side of the lateral member 131 facing the one side of the lateral member 131. Then, the exhaust process is performed through the exhaust portion 121 (S54) and gas remaining after the exhaust process is removed (S55).

Hereinafter, another example of an operation of the vapor deposition apparatus 100 of the current embodiment will be described.

A thin film, for example, a silicon oxide film (SiO$_2$), may be formed by using the vapor deposition apparatus 100 through chemical vapor deposition (CVD). In this regard, a silane gas is injected through the first injection portions 141, and oxygen is injected through the second injection portions 142. Also, an inert gas, for example, argon (Ar), is injected through the second injection portions 142. Alternatively, oxygen may be injected through the first injection portions 141 through which the silane gas is not injected, instead of through the second injection portions 142.

However, this process is just an example of a process performed by the vapor deposition apparatus 100 of the current embodiment, and the present invention is not limited thereto. The vapor deposition apparatus 100 of the current embodiment may perform a vapor deposition process by using any of various methods.

In the vapor deposition apparatus 100 of the current embodiment, the body 130 includes the upper member 132 and the lateral member 131 for injection of gas through the upper member 132 and the lateral member 131. In other words, gas is injected into the space defined between the upper member 132 and the lateral member 131, and at the same time, plasma is generated in the space between the upper member 132 and the lateral member 131. Thus, a vapor deposition process for forming a thin film on the substrate 101 may be performed by efficiently using a space of the vapor deposition apparatus 100.

In particular, the upper member 132 and the lateral member 131 are not formed as one body, and are formed to be separable from each other. Thus, the extents of contamination and damage of the vapor deposition apparatus 100 due to repeatedly performing a vapor deposition process may be easily checked to determine whether the vapor deposition apparatus 100 needs to be washed and repaired.

Also, the receiving portion 120 in which the substrate 101 is placed, is separably formed with the body 130 so as to prevent the substrate 101 from being contaminated by undesired impurity gas. In addition, the exhaust portion 121 is formed at a lower side of the receiving portion 120 so as to facilitate the exhaust process.

Furthermore, the exhaust port 180 is formed in the lateral member 131 so as to easily remove residual impurity gas that is not discharged through the exhaust portion 121, thereby increasing the characteristic of a thin film formed on the substrate 101.

The slit portions 151, connected to the DC power source 150, are disposed between the body 130 and the receiving portion 120 so as to efficiently maintain plasma generated by the plasma generating portion 190, so as to effectively excite gas via the plasma, and so as to make uniform a physical characteristic of the plasma, thereby improving physical characteristics, such as uniformity, density and the like, of a thin film formed on the substrate 101.

Figure 2:
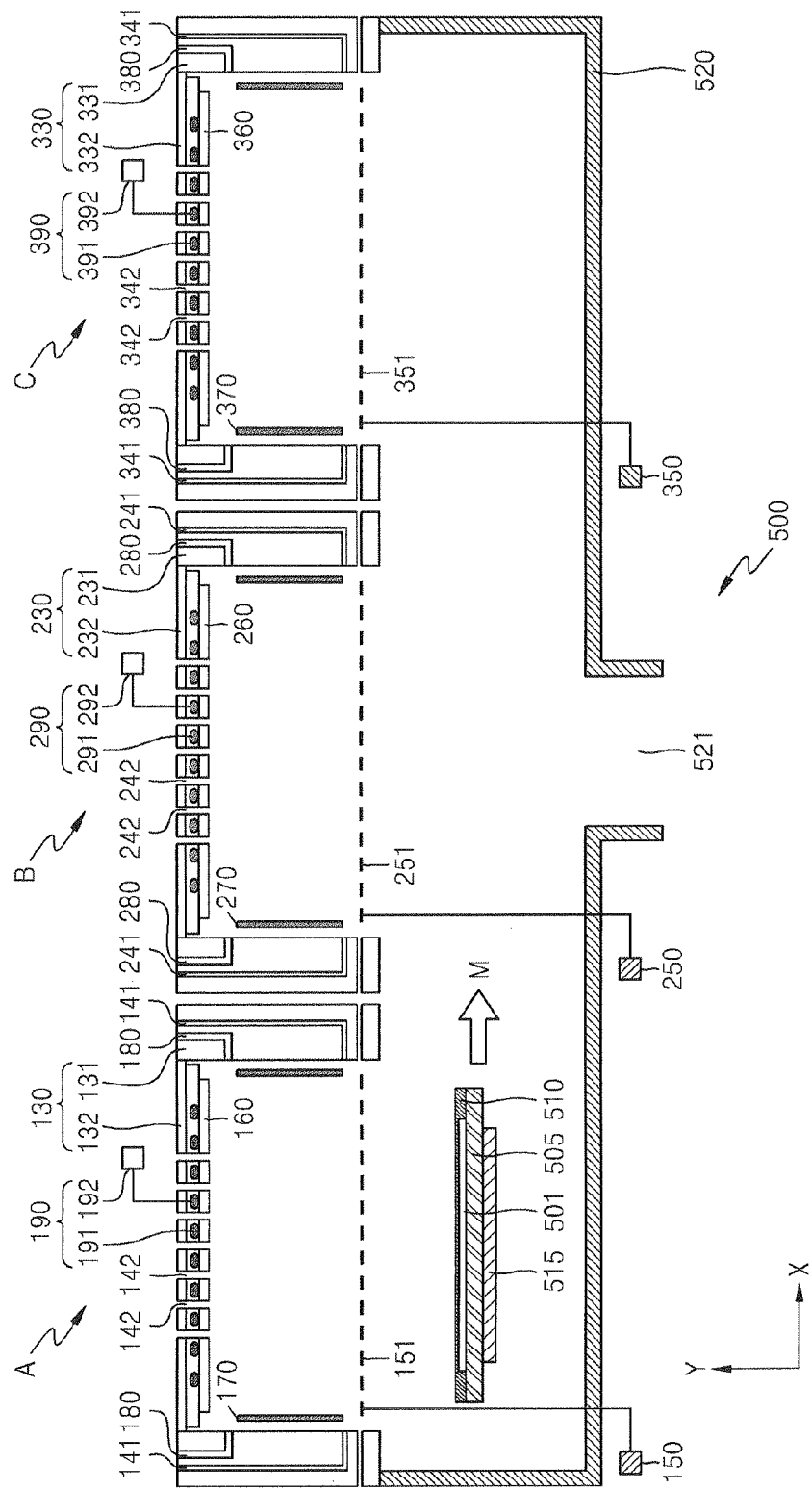
FIG. 2 is a cross-sectional view schematically illustrating a vapor deposition apparatus constructed with another embodiment of the present invention.

FIG. 2 is a cross-sectional view schematically illustrating a vapor deposition apparatus according to another embodiment of the present invention.

Referring to FIG. 2, a vapor deposition apparatus 500 includes a plurality of modules A, B and C, a receiving portion 520, a stage 505, a mask 510, and a driving unit 515. The modules A, B, and C include bodies 130, 230, and 330, first injection portions 141, 241, and 341, second injection portions 142, 242, and 342, plasma generating portions 190, 290, and 390, slit portions 151, 251, and 351, and plasma generating portions 190, 290, and 380, respectively.

Hereinafter, the module A will be described in detail.

The module A includes the body 130, the first injection portions 141, the second injection portions 142, and the plasma generating portion 190. The body 130 includes a lateral member 131 and an upper member 132. The plasma generating portion 190 includes a coil 191 and a plurality of power sources 192.

A cover 160 is disposed on the coil 191. An insulating member 170 is formed to correspond to an inner surface of the lateral member 131. An exhaust port 180 is formed in the lateral member 131. The exhaust port 180 may be connected to a pump (not shown).

The slit portions 151 are disposed between the body 130 and the receiving portion 120, and more specifically, between the lateral member 131 and the receiving portion 120.

Components included in the module A are the same as those described in the previously described embodiment as shown in FIG. 1. In other words, the same reference numerals as in FIG. 1 represent components having the same functions, and thus a detailed description thereof will be omitted.

Configurations of the modules B and C are the same as that of the module A, and thus a detailed description thereof will be omitted.

The modules A, B, and C are arranged in parallel in one direction, that is, in an X-axis direction of FIG. 2. Although FIG. 2 illustrates three modules, the present invention is not limited thereto. Thus, the number of modules may be determined as desired.

The receiving portion 520 is formed to correspond to all the modules A, B, and C. That is, the receiving portion 520 is disposed at one side of the lateral members 131, 231, and 331 to correspond to the lateral members 131, 231, and 331. The receiving portion 520 includes an exhaust port 521 at a lower portion thereof. The exhaust port 521 is an exit for discharging gas, and may be connected to a pump so as to facilitate discharging of gas.

The stage 505 is disposed in the receiving portion 520. The substrate 501 is disposed on the stage 505. In detail, the substrate 501 is disposed on an upper surface of the stage 505.

Then, a fixing unit (not shown) may be disposed to fix the substrate 501 on the stage 505, Examples of the fixing unit may include a clamp, a pressure member, an adhesive material, and the like.

The mask 510 is disposed on the substrate 501. The mask 510 includes an opening (not shown) formed to have a predetermined shape corresponding to a pattern of a thin film to be formed on the substrate 501.

Figure 6:
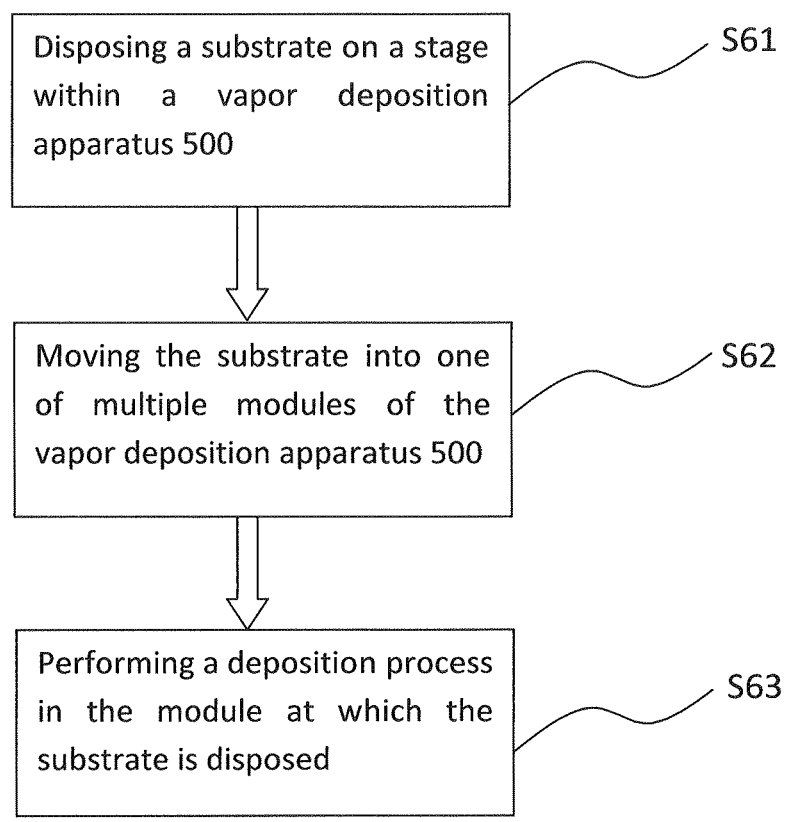
FIG. 6 is a flow chart illustrating an example of an operation method of the vapor deposition apparatus 500 of FIG. 2.

FIG. 6 is a flow chart illustrating an example of an operation method of the vapor deposition apparatus 500 of FIG. 2.

When the substrate 501 is disposed on the stage 505 (S61), the driving unit 515 moves the substrate 501 in one direction, for example, in direction of X-axis (S62). In other words, the driving unit 570 moves the substrate 501 in an arrow direction M parallel to the X-axis direction of FIG. 2. Here, the driving unit 515 may move the substrate 501 backward and forward in the X-axis direction.

The vapor deposition apparatus 100 of the current embodiment moves the substrate 501 using the driving unit 515 to form a thin film by sequentially performing a vapor deposition process in the modules A, B, and C, thereby easily forming a thin film having a desired thickness in the substrate 501 (S63).

In particular, by allowing the driving unit 515 to reciprocate in the X-axis direction, a vapor deposition process may be easily performed in the modules A, B, and C sequentially or in a reverse order. In other words, the vapor deposition process may be performed in an order of the module A, the module B, the module C, the module B, the module A, the module B, and the module C; however, the order of the present invention is not limited thereto. In this regard, gas is injected to be directed to a space between the upper member and the lateral member of each module, and thus a vapor deposition process may be easily performed as desired regardless of a moving direction of the substrate 101.

Figure 3:
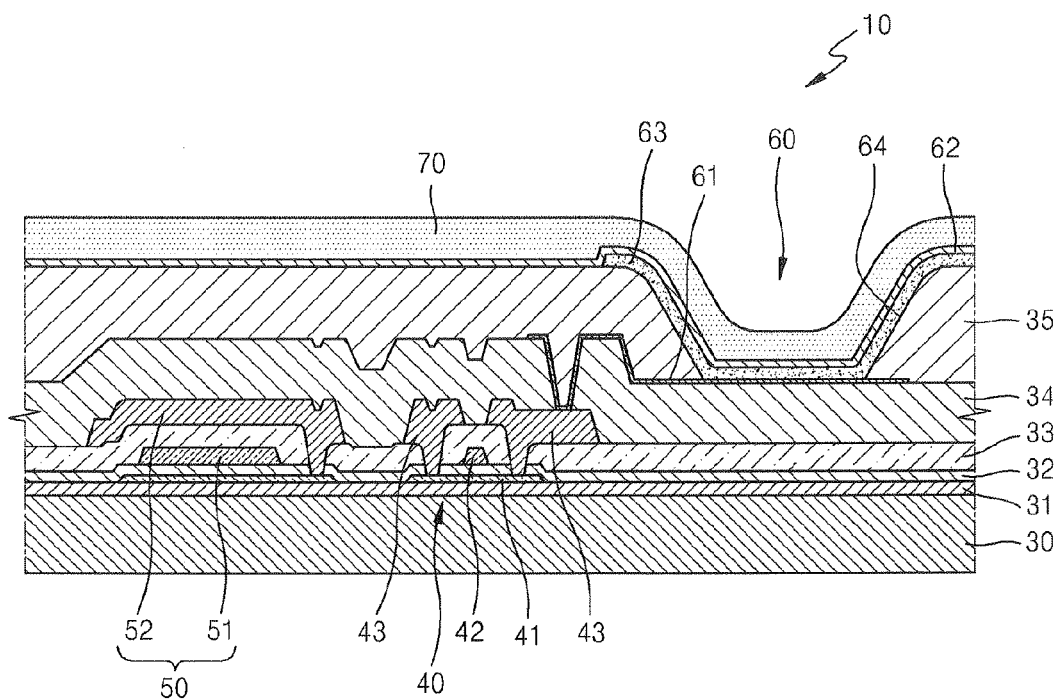
FIG. 3 is a cross-sectional view schematically illustrating an organic light-emitting display apparatus manufactured based on a method of manufacturing an organic light-emitting display apparatus according to still another embodiment of the present invention.

FIG. 3 is a cross-sectional view schematically illustrating an organic light-emitting display apparatus manufactured based on a method of manufacturing an organic light-emitting display apparatus, according to an embodiment of the present invention. Specifically, FIG. 3 illustrates an organic light-emitting display apparatus 10 manufactured using one of the vapor deposition apparatuses 100 and 500 according to the various embodiments of the present invention described above.

In reference to FIG. 3, the organic light-emitting display apparatus 10 is formed on a substrate 30. The substrate 30 may be formed of, for example, glass, plastic, or metal. On the substrate 30, a buffer layer 31 is formed to provide a planarized surface on the substrate 30 and protect the substrate 30 from moisture or foreign substances.

A thin film transistor (TFT) 40, a capacitor 50, and an organic light-emitting device (OLED) 60 are disposed on the buffer layer 31. The TFT 40 includes an active layer 41, a gate electrode 42, and source/drain electrodes 43. The OLED 60 includes a first electrode 61, a second electrode 62, and an intermediate layer 63.

In detail, the active layer 41 is formed in a predetermined pattern on the buffer layer 31. The active layer 41 may include a p-type or n-type semiconductor material. A gate insulating layer 32 is formed on the active layer 41. The gate electrode 42 is formed on a region of the gate insulating layer 32 corresponding to the active layer 41. An interlayer insulating layer 33 is formed covering the gate electrode 42, and the source/drain electrodes 43 are disposed on the interlayer insulating layer 33 to contact a predetermined region of the active layer 41. A passivation layer 34 is formed covering the source/drain electrodes 43, and an additional insulating layer (not shown) may be formed on the passivation layer 34 so as to planarize the passivation layer 34.

The first electrode 61 is formed on the passivation layer 34. The first electrode 61 is electrically connected to the drain electrode 43. A pixel-defining layer 35 is formed covering the first electrode 61. An opening 64 is formed in the pixel defining layer 35, and the intermediate layer 63 including an organic emission layer (not shown) is formed in a region defined by the opening 64. The second electrode 62 is formed on the intermediate layer 63.

An encapsulating layer 70 is formed on the second electrode 62. The encapsulating layer 70 may contain an organic or inorganic material, and may have a structure in which an organic layer and an inorganic layer are alternately stacked.

The encapsulating layer 70 may be formed using one of the vapor deposition apparatuses 100 and 500. In other words, the encapsulating layer 70 may be formed by disposing the substrate 30 on which the second electrode 62 is formed on the stages 105 and 505 of the vapor deposition apparatuses 100 and 500 and then performing a vapor deposition process on the substrate 30.

The present invention is however not limited thereto. For example, insulating layers included in the organic light-emitting display apparatus 10, e.g., the buffer layer 31, the gate insulating layer 32, the interlayer insulating layer 33, the passivation layer 34, and the pixel-defining layer 35, may be formed by using a vapor deposition apparatus constructed with an embodiment of the present invention.

In addition, various thin films, e.g., the active layer 41, the gate electrode 42, the source/drain electrode 43, the first electrode 61, the intermediate layer 63, and the second electrode 62, may also be formed using a vapor deposition apparatus constructed with an embodiment of the present invention.

Here, when the vapor deposition apparatus 500 of FIG. 2 is used, it is possible to rapidly form an insulating layer having a desired thickness and other conductive layers, in particular, an insulating layer, for example, the encapsulating layer 70, which needs to be formed thicker than an electrode.

With a vapor deposition apparatus and a method of manufacturing an organic light-emitting display apparatus according to an embodiment of the present invention, it is possible to efficiently perform a deposition process and to easily improve characteristics of a thin film.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light-emitting display apparatus which comprises:

providing a substrate on a stage of a vapor deposition apparatus which comprises a plurality of modules, a receiving portion disposed in correspondence with all the modules, and the stage disposed within the receiving portion and the stage supporting the substrate, and forming a thin film on the substrate within a module among the plurality of modules while the substrate moves from one module to another, with each module comprising a body comprising an upper member and a lateral member coupled to the upper member, a plurality of first injection portions disposed in the lateral member and injecting at least one gas into a space between the lateral member and the upper member, a second injection portion disposed in the upper member and injecting at least one gas into the space between the lateral member and the upper member, and a plasma generating portion comprising a coil disposed at one surface of the upper member and a power source connected to the coil, the formation of the thin film on the substrate within the module among the plurality of modules comprising:

moving the substrate within the module;

injecting a source gas through the plurality of first injection portions;

after the injection of the source gas, forming an atom layer of the source gas on the substrate by performing a first exhaust process by injecting a first purge gas through the second injection portion;

after the formation of the atom layer of the source gas, injecting a reaction gas through the second injection portion; and after the injection of the reaction gas, forming an atom layer of the reaction gas on the substrate by performing a second exhaust process by injecting a second purge gas through the second injection portion.

2. The method of claim 1, wherein:

the organic light-emitting display apparatus comprises a first electrode, an intermediate layer comprising an organic emission layer, and a second electrode; and the formation of the thin film comprises forming an encapsulating layer on the second electrode.

3. The method of claim 1, wherein the formation of the thin film comprises forming an insulating layer.

4. The method of claim 1, wherein the formation of the thin film comprises forming a conductive layer.

\* \* \* \* \*